United States Patent
Braun (10) Patent No.: US 10,811,587 B2
(45) Date of Patent: Oct. 20, 2020

(54) JOSEPHSON TRANSMISSION LINE FOR SUPERCONDUCTING DEVICES

(71) Applicant: Microsoft Technology Licensing, LLC, Redmond, WA (US)

(72) Inventor: Alexander L Braun, Baltimore, MD (US)

(73) Assignee: Microsoft Technology Licensing, LLC, Redmond, WA (US)

(*) Notice: Subject to any disclaimer, the term of this patent is extended or adjusted under 35 U.S.C. 154(b) by 733 days.

(21) Appl. No.: 15/425,966

(22) Filed: Feb. 6, 2017

(65) Prior Publication Data

US 2019/0019938 A1 Jan. 17, 2019

(51) Int. Cl.
*H03K 3/38* (2006.01)
*H01L 39/22* (2006.01)
(Continued)

(52) U.S. Cl.
CPC .......... *H01L 39/223* (2013.01); *G06N 10/00* (2019.01); *G11C 19/32* (2013.01); *H01L 27/18* (2013.01);
(Continued)

(58) Field of Classification Search
CPC ..... H01L 39/223; H01L 39/025; H01L 39/22; H01L 39/2493; G06N 10/10;
(Continued)

(56) References Cited

U.S. PATENT DOCUMENTS 1,015,348 A * 1/1912 Schopflocher ............ F21V 3/00
362/329
4,749,888 A 6/1988 Sakai et al.
(Continued)

FOREIGN PATENT DOCUMENTS

WO 2017087070 A1 5/2017

OTHER PUBLICATIONS

"D flip-flop", http://www.physics.sunysb.edu/Physics/RSFQ/Lib/AR/dff.html, Retrieved on: Oct. 21, 2016, 5 pages.
(Continued)

*Primary Examiner* — Thienvu V Tran
*Assistant Examiner* — Nusrat Quddus
(74) *Attorney, Agent, or Firm* — Ranjeev Singh; Singh Law, PLLC (57) ABSTRACT

Josephson transmission lines (JTLs) for superconducting devices and related methods are provided. In one example, a device comprising a JTL for propagating quantum pulses in a first direction in response to an application of a clock signal having a plurality of phases is provided. The JTL may include a first inductive element coupled between a first terminal and a second terminal, a first Josephson junction (JJ) coupled between the second terminal and a ground terminal, a second inductive element coupled between the second terminal and a third terminal, and a second JJ coupled between the third terminal and the ground terminal. The second inductive element is configured to form an inductive loop, and the inductive loop may be configured to operate in a mode such that a quantum pulse cannot travel in a second direction opposite from the first direction regardless of a phase of the clock signal.

17 Claims, 3 Drawing Sheets

(51) Int. Cl.
*H01L 27/18* (2006.01)
*G06N 10/00* (2019.01)
*G11C 19/32* (2006.01)
*H03K 19/195* (2006.01)

(52) U.S. Cl.
CPC ............. *H03K 3/38* (2013.01); *H03K 19/195* (2013.01); *H03K 19/1952* (2013.01)

(58) Field of Classification Search
CPC ...... G06N 99/002; G11C 19/32; G11C 11/44; H03K 3/38; H03K 3/038; H03K 19/195; H03K 19/1958; H03K 19/1952; H03K 19/0008; H03K 19/20; H03K 19/17708; H03K 19/1954; H03K 19/21; G06F 17/505; G06F 17/5072; G06F 17/5077; G06F 17/5081; H03M 1/12; H03M 7/003
See application file for complete search history.

(56) References Cited

U.S. PATENT DOCUMENTS

| | | | |
|---|---|---|---|
| 6,549,059 B1 | 4/2003 | Johnson | |
| 7,786,748 B1 | 8/2010 | Herr | |
| 9,467,126 B1 | 10/2016 | Naaman et al. | |
| 10,024,454 B2* | 7/2018 | Baxendell | F16K 31/082 |
| 10,103,736 B1* | 10/2018 | Powell, III | H03K 19/195 |
| 2003/0039138 A1 | 2/2003 | Herr | |
| 2003/0076251 A1 | 4/2003 | Gupta et al. | |
| 2003/0207766 A1 | 11/2003 | Esteve et al. | |
| 2011/0133770 A1 | 6/2011 | Przybysz et al. | |
| 2013/0040818 A1 | 2/2013 | Herr et al. | |
| 2015/0358022 A1 | 12/2015 | Mcdermott et al. | |
| 2016/0013791 A1 | 1/2016 | Herr et al. | |
| 2016/0034609 A1 | 2/2016 | Herr et al. | |
| 2016/0125102 A1 | 5/2016 | Shauck et al. | |
| 2016/0164505 A1 | 6/2016 | Naaman et al. | |
| 2018/0226975 A1* | 8/2018 | Braun | H01L 39/025 |

OTHER PUBLICATIONS

Dimov, et al., "The Josephson Transmission Line as an Impedance Matching Circuit", In WSEAS Transactions on Circuits and Systems, vol. 3, Issue 5, Jul. 2004, 6 pages.

Bourassa, et al., "Josephson junction-embedded transmission-line resonators: from Kerr medium to in-line transmon", In Physical Review A, vol. 86, Jul. 11, 2012, pp. 1-15.

Ortlepp, et al., "Flip-Flopping Fractional Flux Quanta", In Journal of Science Express, Apr. 2006, 14 pages.

Herr, et al., "Ultra-Low-Power Superconductor Logic", In Journal of Applied Physics, vol. 109, No. 10, Mar. 22, 2011, 7 Pages.

"International Search Report and Written Opinion Issued in PCT Application No. PCT/US2018/015825", dated Nov. 21, 2018, 13 Pages.

* cited by examiner

JOSEPHSON TRANSMISSION LINE FOR SUPERCONDUCTING DEVICES

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors and related components based on CMOS technology is the use of superconducting logic based devices.

SUMMARY

In one example, the present disclosure relates to a device comprising at least one Josephson transmission line (JTL) for propagating quantum pulses in a first direction in response to an application of a clock signal having a plurality of phases. The JTL may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal. The second inductive element may be configured to form an inductive loop comprising the first Josephson junction, the second inductive element, and the second Josephson junction, and where the inductive loop may be configured to operate in a mode such that a quantum pulse cannot travel in a second direction opposite from the first direction regardless of a phase of the clock signal.

In another aspect, the present disclosure relates to a device comprising at least one Josephson transmission line (JTL) for propagating single flux quantum (SFQ) pulses in a first direction in response to an application of a clock signal having a plurality of phases. The JTL may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal. The second inductive element may be configured to form an inductive loop comprising the first Josephson junction, the second inductive element, and the second Josephson junction, and where the inductive loop may be configured to operate in a mode such that a single flux quantum (SFQ) pulse cannot travel in a second direction opposite from the first direction regardless of a phase of the clock signal.

In another aspect, the present disclosure relates to a method of operating a Josephson transmission line (JTL) for propagating quantum pulses in a first direction in response to an application of a clock signal having a plurality of phases, where the JTL comprises an inductive loop formed by a first Josephson junction, an inductive element, and a second Josephson junction. The method may include supplying at least via the clock signal an alternating current (AC) bias to the first Josephson junction and the second Josephson junction. The method may further include propagating a quantum pulse in the first direction when a sum of the at least a portion of the AC bias and a current stored in the inductive loop is sufficient to trigger the second Josephson junction. The method may further include preventing propagation of a quantum pulse in a second direction opposite to the first direction regardless of a phase of the clock signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to Josephson transmission lines (JTLs) for use with superconducting logic devices. Certain examples further relate to reciprocal quantum logic (RQL) based devices. Such RQL based devices may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance. An example of a superconductor is Niobium, which has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

Certain examples further relate to Josephson transmission lines (JTLs) that may be used for propagating SFQ pulses through an RQL circuit. In an RQL circuit, the JTLs may be powered by alternating current (AC) and may be used to propagate both positive and negative SFQ pulses. Thus, the alternating current may be used as a clock signal. In this example, positive SFQ pulses may be those pulses that cause a clockwise circulating current when circulating in an inductive loop and negative SFQ pulses may be those pulses that cause a counter-clockwise circulating current when circulating in an inductive loop. In one example, rather than using a clock phase to enforce directionality, JTLs may be used to enforce directionality in an RQL circuit. As an example, certain JTLs may be configured in a way that the SFQ pulses can propagate only in one direction (e.g., left to right) through an RQL circuit regardless of the phase of the AC clock signal. This may advantageously prevent unintentional backward travelling pulses. That, in turn, may advantageously allow the formation of logic gates and superconducting circuits that can receive input pulses (e.g., SFQ pulses) and hold them across multiple clock cycles (e.g., AC clock cycles).

Figure 1:
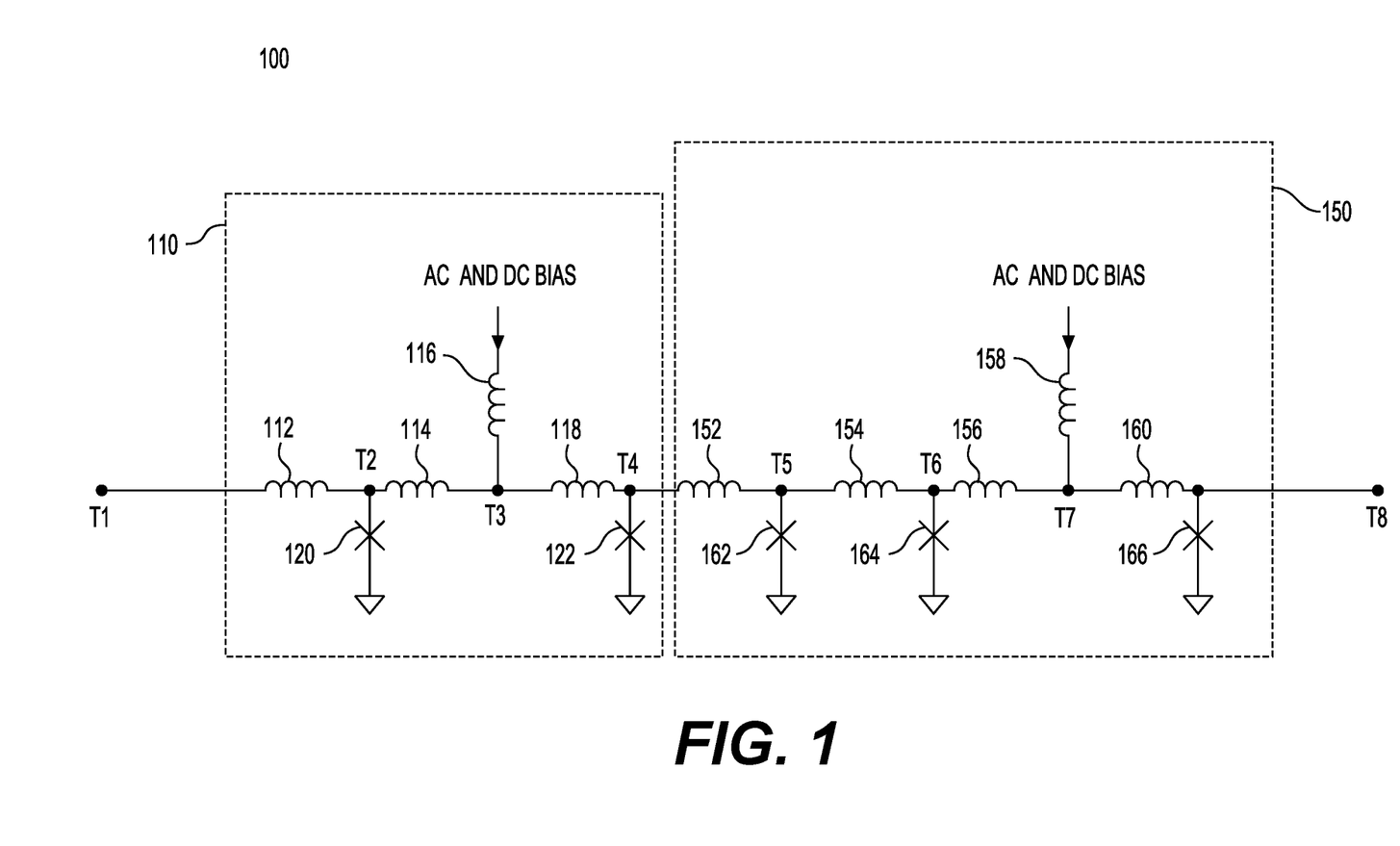
FIG. 1 shows a diagram of a Josephson transmission line (JTL) in accordance with one example.

FIG. 1 shows an example of a superconducting circuit 100 with a Josephson transmission line (JTL) 150 in accordance with one example. In this example, superconducting circuit 100 may include a first JTL 110 and a second JTL 150. JTL 110 may include inductors 112, 114, 116, and 118 as arranged in FIG. 1. JTL 110 may further include Josephson junctions (JJs) 120 and 122 as arranged in FIG. 1. Thus, in this example, JTL 110 may have inductor 112 coupled between terminal T1 and terminal T2. JJ 120 may be coupled between terminal T2 and ground. With respect to the present disclosure, the ground may be virtual ground. Inductor 114 may be coupled between terminal T2 and terminal T3. Inductor 116 may be coupled between terminal T3 and a terminal for receiving AC and/or DC bias. Inductor 118 may be coupled between terminal T3 and terminal T4. JJ 122 may be coupled between terminal T4 and ground. JTL 150 may include inductors 152, 154, 156, 158, and 160 as arranged in FIG. 1. JTL 150 may further include Josephson junctions (JJs) 162, 164, and 166 as arranged in FIG. 1. Thus, in this example, JTL 150 may include an additional inductor 154 and an additional JJ 162. Inductor 152 may be coupled between terminal T4 and terminal T5. JJ 162 may be coupled between terminal T5 and ground. Inductor 154 may be coupled between terminal T5 and terminal T6. JJ 164 may be coupled between terminal T6 and ground. Inductor 156 may be coupled between terminal T6 and terminal T7. Inductor 158 may be coupled between terminal T7 and a terminal for receiving AC and/or DC bias. Inductor 160 may be coupled between terminal T7 and terminal T8. JJ 166 may be coupled between terminal T7 and ground. Inductor 154 and JJ 162 may be configured to form a boundary such that the SFQ pulses can propagate across this boundary in one direction only.

With continued reference to FIG. 1, in one example, this configuration may be achieved by having a large under-biased Josephson junction (e.g., JJ 162) followed by a large storage inductor (e.g., inductor 154). In one example, JJ 162 may be biased (e.g., the sum of DC bias and AC bias at the peak of a clock signal such as an alternating current (AC) clock signal) to less than 45 percent of its critical current. In one example, JJ 162 may be larger than JJ 122 and much larger than JJ 164. In one example, in terms of its critical current, JJ 162 may have critical current 1.1 to 1.4 times the critical current of JJ 122 or other JJs in an unmodified JTL. Regarding inductor sizes, all inductors in FIG. 1, except for inductors 152 and 154, may be sized based on the same relationship to the critical current of the following junction. Thus, in this example, in FIG. 1, inductor 112 is sized based upon the critical current of JJ 120. In general, in this example, the product of the critical current in milliamperes (mA) times the inductor value in pico-Henry (pH) may be approximately $\phi 0/3$, where $\phi 0$ is the magnetic flux quanta, which may be approximately 2.07 mA/pH. Thus, based on this relationship as the Josephson junction gets smaller, the inductor gets larger. Inductors 152 and 154, however, may be sized differently. In one example, inductor 152 may be sized to be approximately 10-30% smaller than it would be based on the critical current of the large JJ 162. In addition, in this example, conversely inductor 154 may be sized to be approximately 60-80% larger than it would be based upon the critical current of JJ 164. In this example, inductor 152 corresponding to JTL 150 may further be reduced in size relative to inductor 112 corresponding to JTL 110 to ensure that JTL 110 can still trigger the larger JJ 162. Although FIG. 1 shows a certain number of components of superconducting circuit 100 arranged in a certain manner, there could be more or fewer number of components arranged differently.

Superconducting circuit 100 may be used as part of an RQL device, such as a decoder, a counter, a programmable logic array (PLA), a processor, a memory, or any other RQL device that may include a JTL. Each of JTL 110 and 150 may be powered by alternating current (AC) and may be used to propagate both positive and negative SFQ pulses. DC bias may also be supplied to the JTLs. In one example, DC bias may be provided using a charge pump that may supply a DC bias current. In this example, AC bias may be provided via a sinusoidal clock signal. JTL 110 may include a superconducting loop formed by JJ 120, inductor 114, inductor 118, and JJ 122. JTL 150 may include a superconducting loop formed by JJ 162, inductor 154, and JJ 164.

As noted earlier, in this example positive SFQ pulses may be those pulses that cause a clockwise circulating current when circulating in an inductive loop and negative SFQ pulses may be those pulses that cause a counter-clockwise circulating current when circulating in an inductive loop. During the positive portion of the AC clock cycle, a JTL (e.g., JTL 110) may propagate a positive pulse from its input to its output and other JTLs may perform a similar function (assuming JTL 150 is not part of the circuit). During this portion of the cycle, the AC bias is supplying positive current to each junction. Since in this example a positive SFQ pulse causes a clockwise circulating current in its loop (for example the loop formed by JJ 120, inductor 114, inductor 118, and JJ 122), these currents are additive in the junction on the right side of the loop, triggering JJ 120 and moving the SFQ pulse to the next loop where the process repeats. Thus, in this example, when the SFQ pulse arriving at terminal T1 flips JJ 120, its initial phase ($\phi_0$) may change by $2\pi$ causing the clockwise circulating current to increase to the sum of the bias current and the new current. When the sum of the two currents exceeds the critical current of JJ 122, it flips. As the two currents are subtractive on the left side of the loop, there is no incentive for the SFQ pulse to move left.

Similarly, during the negative portion of the AC clock cycle, the same thing happens for negative SFQ pulses with the directions of all the currents reversed, but the direction of propagation of the SFQ pulses still being left to right. However, if a positive SFQ were in this system while the AC clock cycle was in the negative portion of the cycle the direction of travel of the SFQ pulse would reverse as the currents would now be additive on the left side of the inductive loop (for example the loop formed by JJ 120, inductor 114, inductor 118, and JJ 122). Similarly, for a negative SFQ pulse present during the positive portion of the AC clock cycle, the direction of travel of the SFQ pulse would reverse as the currents would now be additive on the left side of the inductive loop (for example the loop formed by JJ 120, inductor 114, inductor 118, and JJ 122). Thus, in this example, if the polarity of the pulse and the bias are the same, the currents are additive on the right and the pulses will try to move to the right. If the polarity of the pulse and the bias are different, then the currents are additive on the left and the pulses will try to move leftward.

Referring still to FIG. 1, in the example superconducting circuit 100, SFQ pulses still propagate from left to right during the appropriate portion of the AC cycle. However, once a pulse has propagated past JJ 162, it will never be able to move back past JJ 162 from right to left. In this example, this outcome is achieved, in part, based on the relative sizing of the components as described earlier. In this example, JJ 162 is under-biased relative to the other junctions in the circuit because it is configured as a large junction and because AC bias current is not being directly applied to it. Additionally, the circulating current induced in an inductive loop is proportional to the total inductance of the loop. By making inductor 154 relatively large, the magnitude of any circulating current in the loop formed by JJ 162, inductor 154, and JJ 164 is reduced. In one example, the components are sized and configured in a manner that this current will never be sufficient to trigger JJ 162 regardless of the direction of the AC bias. In this manner, JJ 162 holds the phase value even when the AC clock reverses power. However, in this example, this current is still sufficient to trigger the smaller JJ 164 in combination with the AC bias. Thus, in this example, JTL 150 becomes unidirectional. SFQ pulses will be propagated left to right from its input to output, but never right to left from output to input regardless of the AC bias direction.

Figure 2:
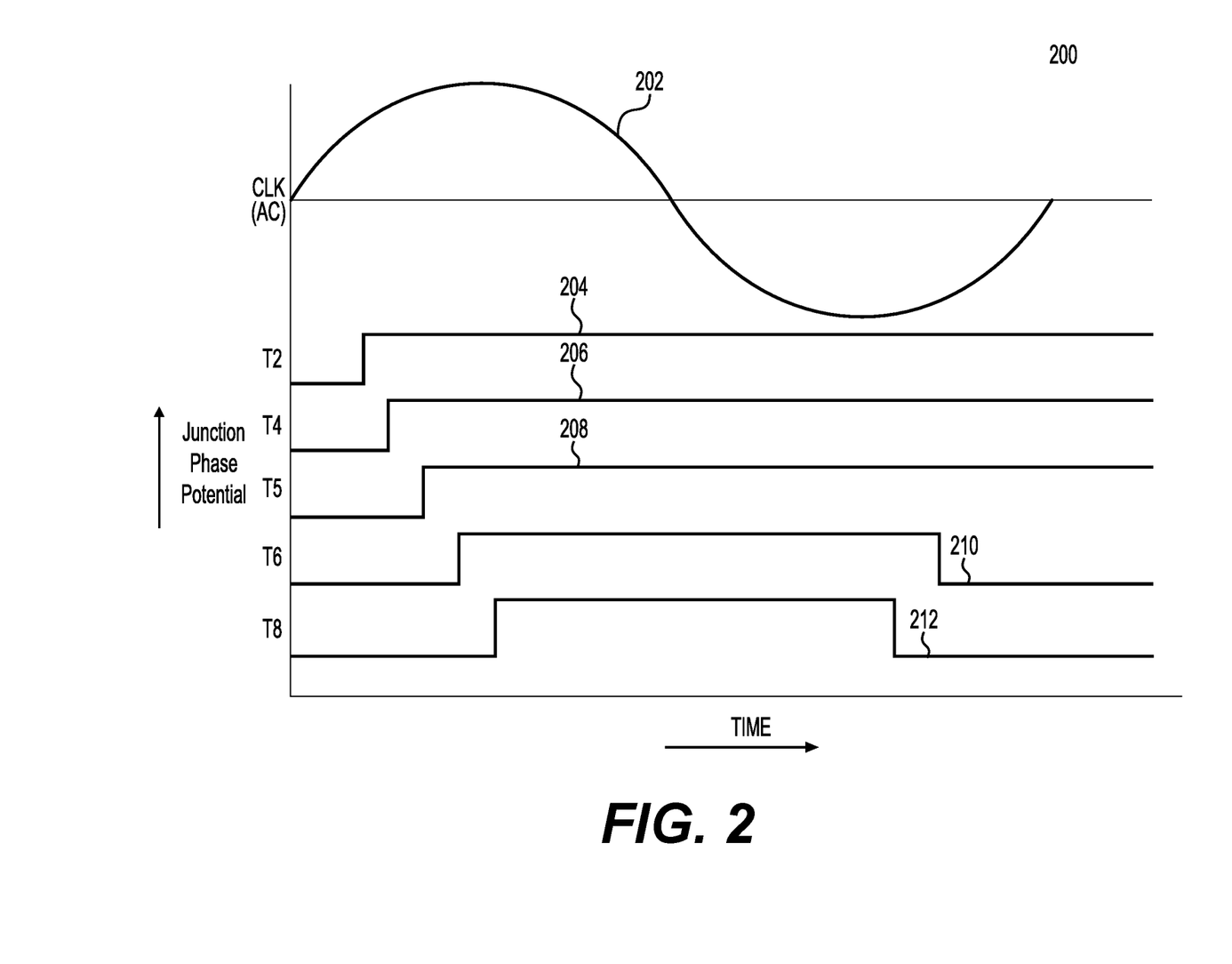
FIG. 2 shows a diagram of waveforms for the Josephson transmission line (JTL) of FIG. 1 in accordance with one example.

FIG. 2 shows a diagram 200 of waveforms for the Josephson transmission line (JTL) of FIG. 1 in accordance with one example. These waveforms represent a phase of a Josephson junction that may toggle between two states in response to an application of an alternating current (AC) bias from clock signal (CLK) 202. The value of the JJ phase at terminal T2 in FIG. 2 is represented by waveform 204. When positive AC bias from the clock signal 202 is applied to JJ 120, and that bias is combined with a positive SFQ pulse arriving via terminal T1, JJ 120 may trigger showing a transition from a low value to a high value. The value of the JJ phase at terminal T4 in FIG. 2 is represented by waveform 206. When positive AC bias from the clock signal 202 is applied to JJ 122, and that bias is combined with a positive SFQ pulse arriving via terminal T3, JJ 122 may trigger showing a transition from a low value to a high value. The value of the JJ phase at terminal T5 in FIG. 2 is represented by waveform 208. When positive AC bias from the clock signal 202 is applied to JJ 162, and that bias is combined with a positive SFQ pulse arriving via terminal T4, JJ 162 may trigger showing a transition from a low value to a high value. The value of the JJ phase at terminal T6 in FIG. 2 is represented by waveform 210. When positive AC bias from the clock signal 202 is applied to JJ 164, and that bias is combined with a positive SFQ pulse arriving via terminal T5, JJ 164 may trigger showing a transition from a low value to a high value. The value of the JJ phase at terminal T8 in FIG. 2 is represented by waveform 212. When positive AC bias from the clock signal 202 is applied to JJ 166, and that bias is combined with a positive SFQ pulse arriving via terminal T8, JJ 166 may trigger showing a transition from a high value to a low value. Similarly, during the negative cycle of clock signal 202, the value of the JJ phase at terminal T6 in FIG. 2 is also represented by waveform 210. When negative AC bias from the clock signal 202 is applied to JJ 164, and that bias is combined with a positive SFQ pulse arriving via terminal T8, JJ 164 may trigger showing a transition from a high value to a low value. However, during the negative cycle of clock signal 202, as shown by waveform 208, the combination of negative AC bias from the clock signal 202 a bias from a positive SFQ pulse arriving via terminal T6 may not trigger JJ 162. This will prevent the propagation of any SFQ pulses in a right to left direction.

Figure 3:
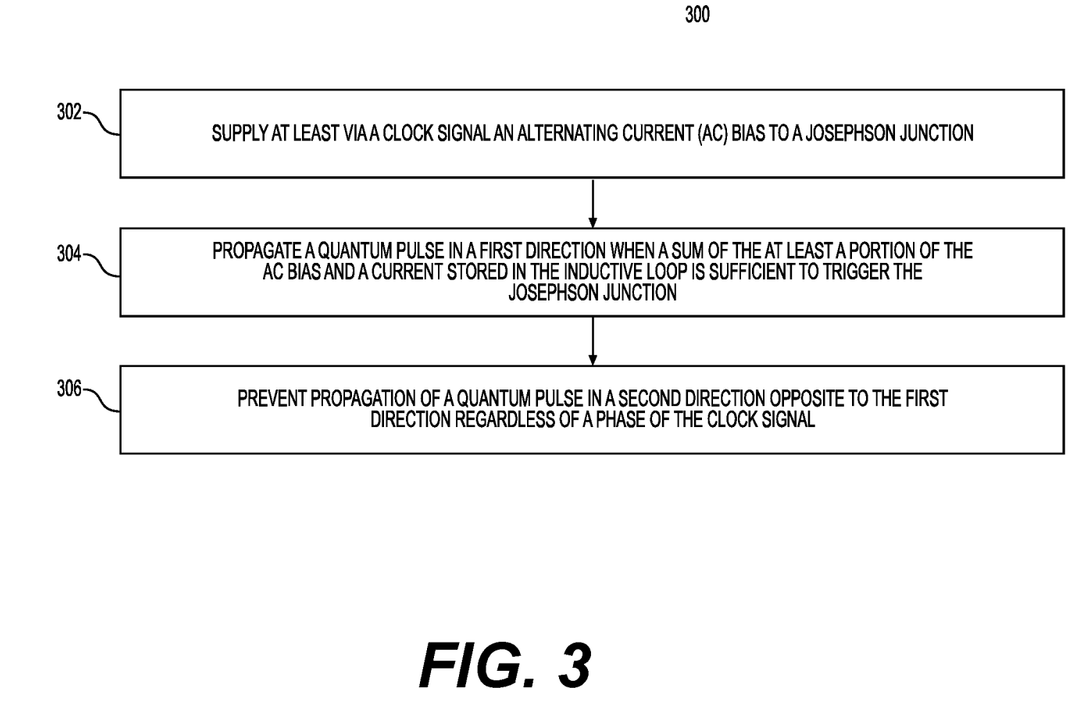
FIG. 3 shows a flowchart of a method for operating the JTL of FIG. 1.

FIG. 3 shows a flowchart 300 of a method for operating the JTL of FIG. 1. In step 302, an alternating current (AC) bias may be supplied to a Josephson junction. For example, as shown in FIG. 1, AC bias may be provided or supplied via inductor 158 and inductor 116 to Josephson junctions in a JTL. The AC bias may be provided via a sinusoidal signal that may act as a power source for the JTL as well. In addition, a DC bias may also be provided from a charge pump or a similar mechanism.

Step 304 may include propagating a quantum pulse in a first direction when a sum of the at least portion of the AC bias and a current stored in the inductive loop is sufficient to trigger the Josephson junction. As discussed earlier, the quantum pulse may comprise a single flux quantum (SFQ)

pulse, and there may be positive SFQ pulses and negative SFQ pulses. The quantum pulses may propagate in a first direction (for example, left to right) when, as an example, Josephson junction 164 of FIG. 1 is triggered in response to an application of the sum of the at least a portion of the AC bias and a current stored in the inductive loop.

Step 306 may include preventing propagation of a quantum pulse in a second direction (e.g., right to left) opposite to the first direction (e.g., left to right) regardless of the phase of the clock signal. This step may include enforcing a direction of propagation with respect to the quantum pulses being transmitted by a JTL, such as the JTL in FIG. 1. As explained earlier, the propagation of the quantum pulse in the second direction opposite to the first direction regardless of the phase of the clock signal may be accomplished by under-biasing the Josephson junction relative to other Josephson junctions in the JTL. Although FIG. 3 shows a certain number of steps performed in a certain manner, there may be fewer or additional steps performed in a different manner. As an example, the step related to preventing propagation of a quantum pulse in a second direction (e.g., right to left) opposite to the first direction (e.g., left to right) regardless of the phase of the clock signal may further include configuring inductance values of the inductors in the JTL. In this example, as shown with respect to FIG. 1, inductor 154 may be larger than the other inductors in the JTL to ensure a large inductance value for the inductive loop formed by JJ 162, inductor 154, and JJ 164. Although FIG. 3 shows a flow chart with certain number of steps performed in a certain manner, there could be more or fewer steps performed differently.

In conclusion, in one example, the present disclosure relates to a device comprising at least one Josephson transmission line (JTL) for propagating quantum pulses in a first direction in response to an application of a clock signal having a plurality of phases. The JTL may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal. The second inductive element may be configured to form an inductive loop comprising the first Josephson junction, the second inductive element, and the second Josephson junction, and where the inductive loop may be configured to operate in a mode such that a quantum pulse cannot travel in a second direction opposite from the first direction regardless of a phase of the clock signal.

The JTL may further comprise a third inductive element coupled between the third terminal and a fourth terminal, a fourth inductive element coupled between the fourth terminal and a terminal for receiving an alternating current bias, a fifth inductive element coupled between the fourth terminal and a fifth terminal, and a third Josephson junction coupled between the fifth terminal and the ground terminal. The mode be a unidirectional mode in which the second inductor is configured to store a current in the inductive loop. The quantum pulses may comprise single-flux quantum (SFQ) pulses. The SFQ pulses may be positive SFQ pulses and negative SFQ pulses.

The JTL may be configured to receive a bias current from the clock signal. At least a portion of the bias current from the clock signal may be provided to the inductive loop. During the unidirectional mode, the JTL may be configured to propagate a positive pulse in the first direction when a sum of the at least the portion of the bias current and a current stored by the second inductive element is sufficient to trigger the second Josephson junction.

In another aspect, the present disclosure relates to a device comprising at least one Josephson transmission line (JTL) for propagating single flux quantum (SFQ) pulses in a first direction in response to an application of a clock signal having a plurality of phases. The JTL may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal. The second inductive element may be configured to form an inductive loop comprising the first Josephson junction, the second inductive element, and the second Josephson junction, and where the inductive loop may be configured to operate in a mode such that a single flux quantum (SFQ) pulse cannot travel in a second direction opposite from the first direction regardless of a phase of the clock signal.

The JTL may further comprise a third inductive element coupled between the third terminal and a fourth terminal, a fourth inductive element coupled between the fourth terminal and a terminal for receiving an alternating current bias, a fifth inductive element coupled between the fourth terminal and a fifth terminal, and a third Josephson junction coupled between the fifth terminal and the ground terminal. The mode be a unidirectional mode in which the second inductor is configured to store a current in the inductive loop. The SFQ pulses may be positive SFQ pulses and negative SFQ pulses.

The JTL may be configured to receive a bias current from the clock signal. At least a portion of the bias current from the clock signal may be provided to the inductive loop. During the unidirectional mode, the JTL may be configured to propagate a positive pulse in the first direction when a sum of the at least the portion of the bias current and a current stored by the second inductive element is sufficient to trigger the second Josephson junction.

In another aspect, the present disclosure relates to a method of operating a Josephson transmission line (JTL) for propagating quantum pulses in a first direction in response to an application of a clock signal having a plurality of phases, where the JTL comprises an inductive loop formed by a first Josephson junction, an inductive element, and a second Josephson junction. The method may include supplying at least via the clock signal an alternating current (AC) bias to the first Josephson junction and the second Josephson junction. The method may further include propagating a quantum pulse in the first direction when a sum of the at least a portion of the AC bias and a current stored in the inductive loop is sufficient to trigger the second Josephson junction. The method may further include preventing propagation of a quantum pulse in a second direction opposite to the first direction regardless of a phase of the clock signal.

The inductive element may be configured to store the current stored in the inductive loop. The quantum pulses may comprise single-flux quantum (SFQ) pulses. The SFQ pulses may be positive SFQ pulses and negative SFQ pulses. The JTL may further comprise a set of Josephson junctions, and where the preventing the propagation of the quantum pulse in the second direction opposite to the first direction regardless of the phase of the clock signal may further comprise under-biasing the second Josephson junction relative to other Josephson junctions in the set of Josephson junctions. The inductive loop may have an inductance value, and the preventing the propagation of the quantum pulse in the second direction opposite to the first direction regardless of the phase of the clock signal may further comprise configuring the inductance value to be larger relative to other inductive loops in the JTL.

It is to be understood that the methods, modules, and components depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A device comprising:
  a first Josephson transmission line (JTL) for propagating quantum pulses received via a first terminal, the first JTL comprising:
    a first inductive element coupled between the first terminal and a second terminal,
    a first Josephson junction coupled between the second terminal and a ground terminal,
    a second inductive element coupled between the second terminal and a third terminal, wherein the third terminal is coupled to receive an alternating current (AC) bias signal,
    a third inductive element coupled between the third terminal and a fourth terminal, and
    a second Josephson junction coupled between the fourth terminal and the ground terminal, wherein the first JTL is configured such that a first subset of the quantum pulses can propagate in a first direction from the first terminal towards the fourth terminal, when the AC bias signal has a first phase and a second subset of the quantum pulses can propagate in a second direction, opposite to the first direction, when the AC bias signal has a second phase; and
  a second JTL comprising:
    a fourth inductive element coupled between the fourth terminal and a fifth terminal,
    a third Josephson junction coupled between the fifth terminal and the ground terminal,
    a fifth inductive element coupled between the fifth terminal and a sixth terminal,
    a fourth Josephson junction coupled between the sixth terminal and the ground terminal,
    a sixth inductive element coupled between the sixth terminal and a seventh terminal, wherein the seventh terminal is coupled to receive the AC bias signal,
    a seventh inductive element coupled between the seventh terminal and an eighth terminal, and
    a fifth Josephson junction coupled between the eighth terminal and the ground terminal, wherein the second JTL is configured such that the first subset of quantum pulses and the second subset of the quantum pulses can propagate only in the first direction after propagating past the third Josephson junction regardless of whether the AC bias signal has the first phase or the second phase.

2. The device of claim 1, wherein the fifth inductive element is configured to store a current in an inductive loop.

3. The device of claim 2, wherein the quantum pulses comprise single-flux quantum (SFQ) pulses.

4. The device of claim 3, wherein the SFQ pulses comprise positive SFQ pulses and negative SFQ pulses.

5. The device of claim 2, wherein each of the first JTL and the second JTL is configured to receive a bias current from the clock signal.

6. The device of claim 5, wherein at least a portion of the bias current from the clock signal is provided to the inductive loop.

7. The device of claim 6, wherein the second JTL is configured to propagate a positive single-flux quantum pulse in the first direction when a sum of the at least the portion of the bias current and a current stored by the fifth inductive element is sufficient to trigger the fourth Josephson junction.

8. The device of claim 1, wherein each inductive element is sized based on a relationship to a critical current of a Josephson junction, and wherein the fifth inductive element is sized to be larger than a size determined based on a relationship to a critical current of the third Josephson junction.

9. The device of claim 8, wherein the fourth inductive element is sized to be smaller than the size determined based on the relationship to the critical current of the third Josephson junction.

10. A device comprising:
  A first Josephson transmission line (JTL) for propagating single-flux quantum (SFQ) pulses in a first direction in response to an application of a clock signal having a plurality of phases, the first JTL comprising:
    a first inductive element coupled between a first terminal and a second terminal, a first Josephson junction coupled between the second terminal and a ground terminal,
a second inductive element coupled between the second terminal and a third terminal,
a third inductive element coupled between the third terminal and a fourth terminal, and
a second Josephson junction coupled between the fourth terminal and the ground terminal, wherein the first JTL is configured such that single-flux quantum (SFQ) pulses can propagate in a first direction from the first terminal towards the fourth terminal and in a second direction; and
a second JTL comprising:
a fourth inductive element coupled between the fourth terminal and a fifth terminal,
a third Josephson junction coupled between the fifth terminal and the ground terminal,
a fifth inductive element coupled between the fifth terminal and a sixth terminal,
a fourth Josephson junction coupled between the sixth terminal and the ground terminal,
a sixth inductive element coupled between the sixth terminal and a seventh terminal, wherein the seventh terminal is coupled to receive the AC bias signal,
a seventh inductive element coupled between the seventh terminal and an eighth terminal, and
a fifth Josephson junction coupled between the eighth terminal and the ground terminal, wherein the second JTL is configured such that the SFQ pulses can only propagate in the first direction after propagating past the third Josephson junction during any of the plurality of phases associated with the clock signal.

11. The device of claim 8, wherein the fifth inductive element is configured to store a current in an inductive loop.

12. The device of claim 11, wherein each of the first JTL and the second JTL is configured to receive a bias current from the clock signal.

13. The device of claim 12, wherein at least a portion of the bias current from the clock signal is provided to the inductive loop.

14. The device of claim 13, wherein the second JTL is configured to propagate an SFQ pulse in the first direction when a sum of the at least the portion of the bias current and a current stored by the fifth inductive element is sufficient to trigger the fourth Josephson junction.

15. The device of claim 10, wherein the SFQ pulses comprise positive SFQ pulses and negative SFQ pulses.

16. The device of claim 10, wherein each inductive element is sized based on a relationship to a critical current of a Josephson junction, and wherein the fifth inductive element is sized to be larger than a size determined based on a relationship to a critical current of the third Josephson junction.

17. The device of claim 16, wherein the fourth inductive element is sized to be smaller than the size determined based on the relationship to the critical current of the third Josephson junction.

* * * * *